United States Patent [19]

Sasaki et al.

[11] Patent Number: 5,245,575
[45] Date of Patent: Sep. 14, 1993

[54] REGISTER CIRCUIT FOR COPYING CONTENTS OF ONE REGISTER INTO ANOTHER REGISTER

[75] Inventors: Takayoshi Sasaki; Katsumi Miura, both of Tokyo, Japan

[73] Assignee: NEC Corporation, Tokyo, Japan

[21] Appl. No.: 755,848

[22] Filed: Sep. 6, 1991

[30] Foreign Application Priority Data

Sep. 7, 1990 [JP] Japan .................. 2-237418

[51] Int. Cl.$^5$ .................. G11C 13/00; G11C 11/40
[52] U.S. Cl. .................. 365/189.12; 365/154
[58] Field of Search .......... 365/189.01, 189.12, 365/230.01, 230.04, 154

[56] References Cited

U.S. PATENT DOCUMENTS

4,953,127  8/1990  Nagahashi et al. .......... 365/154

Primary Examiner—Terrell W. Fears
Attorney, Agent, or Firm—Whitham & Marhoefer

[57] ABSTRACT

A register circuit is disclosed which has input/output data lines, a first register having a first flip-flop and a first transfer gate provided between the input/output terminals of the flip-flop and the input/output data lines and connect them in response to a first selection signal, a second register having a second flip-flop and a second transfer gate provided between the input/output terminals of the flip-flop and the input/output data lines and connect them in response to a second selection signal, and a copy control circuit having a first and a second transistors, connected in series between the input/output terminals of the second flip-flop and the power terminals, to which are supplied stored data of the first flip-flop and a copy signal, respectively.

12 Claims, 5 Drawing Sheets

REGISTER CIRCUIT FOR COPYING CONTENTS OF ONE REGISTER INTO ANOTHER REGISTER

BACKGROUND OF THE INVENTION

The present invention relates to a register circuit for temporarily storing data, and, more particularly, to a register circuit provided in a microcontroller such as a microcomputer and a DMA (Direct Memory Access) controller.

A register circuit is widely used in microcontrollers as a storage circuit for storing operand data, status information, or control information. Each bit of the register circuit has the same constitution as the memory cell of an SRAM, (Static Random Access Memory) and thus has a flip-flop for retaining information and a transfer gate coupled between the input/output terminal of the flip-flop and a data input/output lines and made conductive by a selection signal. When the selection signal goes to an active level, the transfer gate connects the input/output terminal of the flip-flop to the data input/output line. In a data write operation, the data input/output line is driven in response to data to be written. The flip-flop thus stores the data. On the other hand, in a data read operation, the voltage level appearing on the input/output line in response to the data stored in the flip-flop is detected to obtain the data.

The register circuit employed in a microcontroller has relatively small storage capacity in general and is thus constituted of a limited number of registers. For this reason, a certain register or registers are used in common for various kinds of task processing operation. In general old data stored in such a register are allowed to be destroyed in accordance with the change in task operation to be processed. However, such old data often is required to be maintained for resuming the previous task operation. In such a case, in response to the changeover of the task operation, the data used in the previous processing task operation have to be saved in another register.

Considering a control register, it is required to store the contents of a certain register into the control register as new control information for a new operation mode in order to change an operation mode or status. For that purpose, the data in question are first read out of the corresponding register and then written into a target register. In other words, a data read cycle and a data write cycle have to be initiated. In order to execute such a cycle, which is called a bus cycle in a microcontroller, several clock periods are required. That is, against the demand in recent years for the reduction of even one clock time in the operation of the microcontroller, there are required several clock periods for a simple saving or transfer of data.

SUMMARY OF THE INVENTION

It is therefore an object of the present invention to provide a register circuit in which data transfer is performed from one register to another register within a short time.

It is another object of the present invention to provide a register circuit in which the contents of one register is copied into another register within one clock period.

It is still another object of the present invention to provide a register circuit in which data transfer between registers is performed without initiating any bus cycle.

A register circuit according to the present invention comprises an input/output data line, a first register including a first flip-flop and a first transfer gate provided between an input/output terminal of the first flip-flop and the input/output data line to form an electrical path therebetween in response to a first selection signal, a second register including a second flip-flop and a second transfer gate provided between the input/output terminal of the second flip-flop and the input/output data line to form an electrical path therebetween in response to a second selection signal, and a copy control circuit including first and second transistors connected in series between the input/output terminal of the second flip-flop and a power terminal and supplied respectively with data stored in the first flip-flop and a copy signal to copy the data of the first flip-flop to the second flip-flop in response to an active level of the copy signal.

Thus, only by the activation of the copy signal, data stored in the first register is copied saved or transferred, to the second register. That is, the contents of the first register are transferred to the second register within one clock period without initiating any bus cycle.

BRIEF DESCRIPTION OF THE DRAWINGS

The above-mentioned and other objects, features and advantages of the present invention will become more apparent by reference to the following detailed description taken in conjunction with the accompanying drawings, wherein.

DESCRIPTION OF THE PREFERRED EMBODIMENTS

Figure 1:
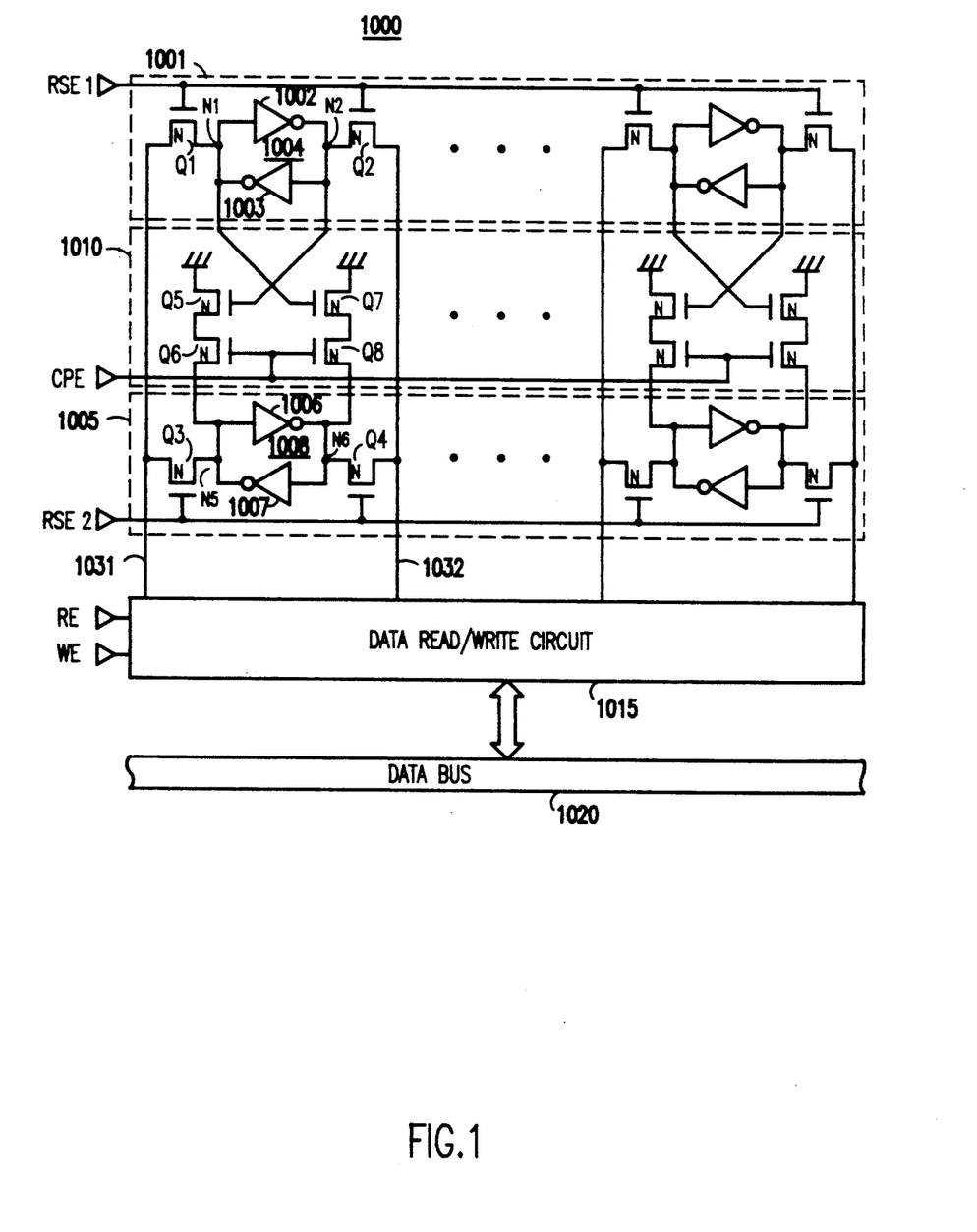
FIG. 1 is a circuit diagram representative of an embodiment of the present invention.

Referring to FIG. 1, a register circuit 1000 according to an embodiment of the present invention includes a first register 1001 and a second register 1005, and further includes a copy control circuit 1010 in accordance with the present invention. While each of the registers 1001 and 1005 is of an eight-bit construction, only the least significant bit (LSB) portion and the most significant bit (MSB) are shown in the drawing. Since all bit positions have the same construction, only the LSB portion will be described in detail.

The LSB portion of the register 1001 has a flip-flop 1004 consisting of two inverters 1002 and 1003, an N-channel MOS transistor Q1 connected between one of the input/output terminals, N1, of the flip-flop 1004 and one of data input/output lines, 1031, for the LSB, and an N-channel MOS transistor Q2 connected between the other input/output terminal N2 and the other data input/output line 1032. The transistors Q1 and Q2 operate as a transfer gate, and a selection signal RSE1 for the first register 1001 is supplied to the gates thereof. The LSB portion of the second register 1005 has the same construction as that of the first register. Namely, the LSB portion of the second register 1005 has a flip-flop 1008 consisting of two inverters 1006 and 1007, an N-channel MOS transistor Q3 connected between one input/output terminal N5 of the flip-flop 1008 and the data input/output line 1031, and an N-channel MOS transistor Q4 connected between the other input/output terminal N6 and the data input/output line 1032. A selection signal RSE2 for the second register 1005 is supplied to the gates of the transistors Q3 and Q4. Each of the inverters 1002, 1003, 1006, and 1007 is a CMOS inverter.

The circuit for the LSB portion in the copy control circuit 1010 consists of four N-channel MOS transistors Q5 to Q8. The transistors Q5 and Q6 are connected in series between the input/output terminal N5 of the flip-flop 1008 of the second register 1005 and a ground terminal, whereas the transistors Q7 and Q8 are connected in series between the other input/output terminal N6 of the flip-flop 1008 and a ground terminal. The gates of the transistors Q5 and Q7 are connected to the input/output terminals N2 and N1 of the flip-flop 1004, respectively. A copy-enable signal CPE is supplied to the gates of the transistors Q6 and Q8. The transistors Q5 and Q6 have a driving capability higher than the driving capability of inverter 1007, and the transistors Q7 and Q8 have a driving capability higher that of the inverter 1006.

The data input/output lines 1031 and 1032 are connected along with other input/output lines to a data read/write circuit 1015 which is in turn connected to an eight-bit data bus 1020. The operation of the data read/write circuit 1015 is controlled by a read-enable signal RE and a write-enable signal WE.

The signals RSE1, RSE2, CPE, RE and WE are generated by a controller such as a CPU (Central Processing Unit) (not shown).

In the operation, when data are required to be written into the first register 1001, the signals RSE1 and WE go to active high level with the data to be written being transferred onto the data bus 1020. In response to the signal WE, the data read/write circuit 1015 drives the data input/output lines 1031 and 1032 using the true and the complement levels of the data to be written. For example, assuming that data "0" is to be written, the line 1031 is driven to the ground level while the line 1032 is driven to the Vcc level. On the other hand, the transistors Q1 and Q2 are turned on by the signal RSE1. As a result, the data "0" is stored in the flip-flop 1004.

In a data read operation for reading out data from the second register 1005, the signals RSE2 and RE go to the active high level. The transistors Q3 and Q4 are turned on so that the true and the complement levels of the data stored in the flip-flop 1008 appears on the data input/output lines 1031 and 1032, respectively. Assuming that the flip-flop 1008 stores data "1", the data line 1031 goes to the Vcc level and the line 1032 goes to the ground level. The data read/write circuit 1015 is brought into the read operation mode to detect the levels of the lines 1031 and 1032. Consequently, the data "1" is outputted onto the corresponding bit (LSB) data bus line of the data bus 1020.

When the contents of the first register 1001 are required to copied or saved into the second register 1005, the copy-enable signal CPE goes to the active high level. As a result, the transistors Q6 and Q8 are turned on. At this time, one of the transistors Q5 and Q7 is in a conductive state in accordance with the data stored in the flip-flop 1004 of the first register 1001. Assuming that data "0" is stored, the transistor Q5 is turned on, while the transistor Q7 is turned off. As already mentioned, the transistors Q5 and Q6 have a driving capability higher than that of the inverter 1007 and the transistors Q7 and Q8 have a driving capability higher than that of the inverter 1006. Accordingly, the input/output terminals N5 of the flip-flop 1008 is driven to the ground level, while the other input/output terminal N6 is driven to the Vcc level regardless of the stored data of the second register 1005. The data "0" is thus copied in the flip-flop 1008. That is, only by bringing the copy-enable signal CPE to the active high level, the contents of the first register 1001 is copied to the second register 1005. A controller (not shown) generates various kinds of signals RSE1, RSE2, CPE, RE and WE in synchronism with an operating clock signal. Therefore, the contents of the first register 1001 are copied to the second register 1005 within a single clock period without initiating any data read/write bus cycle.

Figure 2:
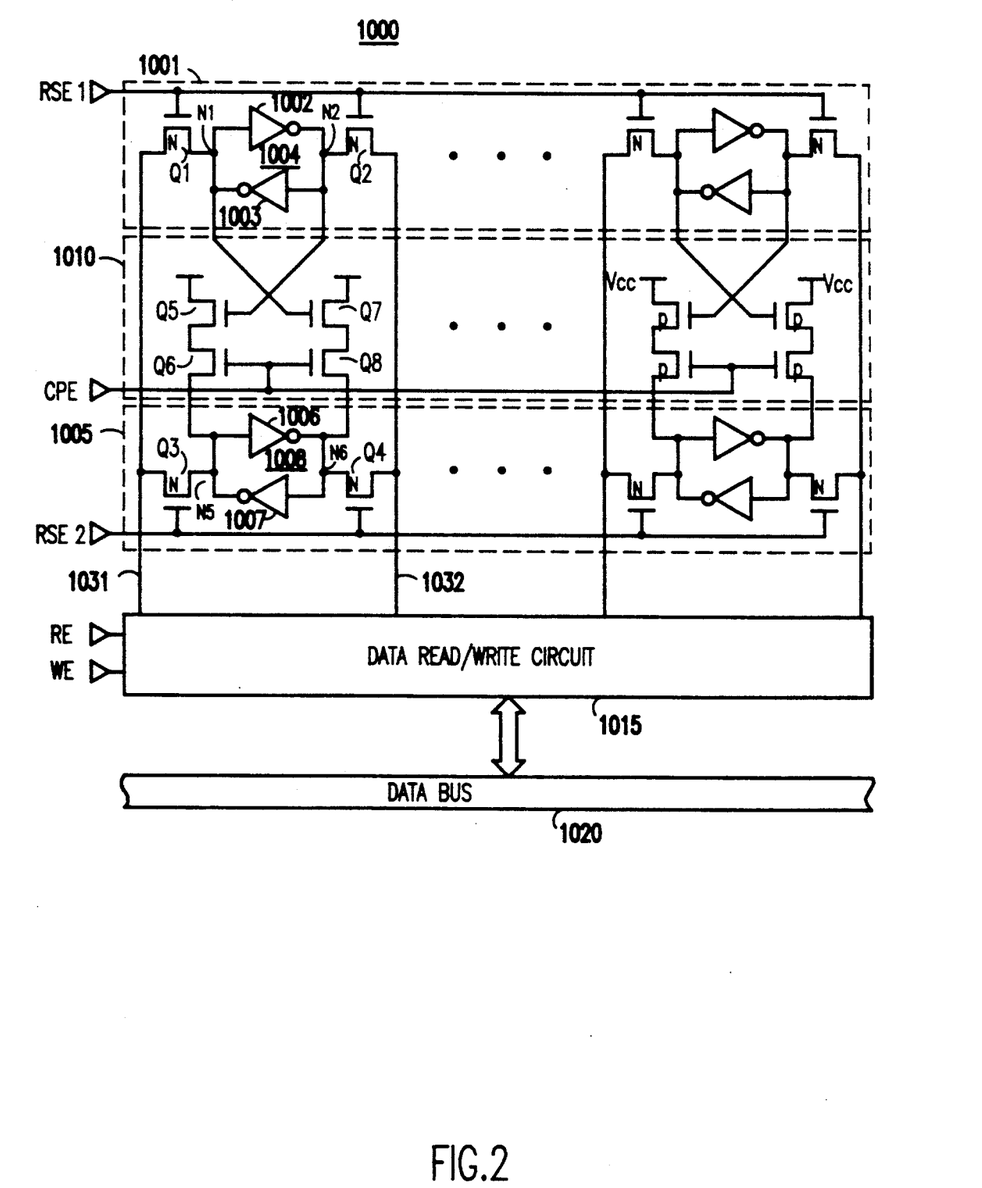
FIG. 2 is a circuit diagram representative of another embodiment of the present invention.

Referring to FIG. 2, there is shown a register circuit 1000 according to another embodiment of the present invention, in which the same constituents as those in FIG. 1 are denoted by identical symbols and reference numerals to omit further explanation thereof.

In this embodiment, the N-channel MOS transistors Q5, Q6, Q7 and Q8 are replaced by the P-channel MOS transistors Q15, Q16, Q17 and Q18. The transistors Q15 and Q17 are connected to a power terminal Vcc. Further, an inverter 1040 is provided to invert the level of the copy-enable signal CPE and supply the inverted signal to the gates of the transistors Q16 and Q18. The transistors Q15 and Q16 have a driving capability higher than that of the inverter 1007, and the transistors Q17 and Q18 have a driving capability higher than that of the inverter 1006.

When the copy enable signal CPE goes to the active high level and accordingly its inverted signal goes to the active low level, the transistors Q16 and Q18 are turned on. If the flip-flop 1004 of the first register 1001 stores data "0", the transistor Q15 is turned off, while the transistor Q17 is turned on. Accordingly, the input/output terminal N6 of the flip-flop 1008 of the second register 1005 is driven to the Vcc level, and the flip-flop 1008 stores the data "0". In this manner, the contents of the first register 1001 is copied to the second register 1005.

While the above embodiments, includes two registers 1001 and 1005, a register circuit including three or more registers can be also realized similarly. For example, a third register may be coupled to the second register 1005 through a second copy control circuit that is of the same construction as the copy control circuit 1010. With this arrangement, the contents of the second register 1005 is first copied into the third register, and the contents of the first register 1001 is then copied into the second register 1005.

Figure 3:
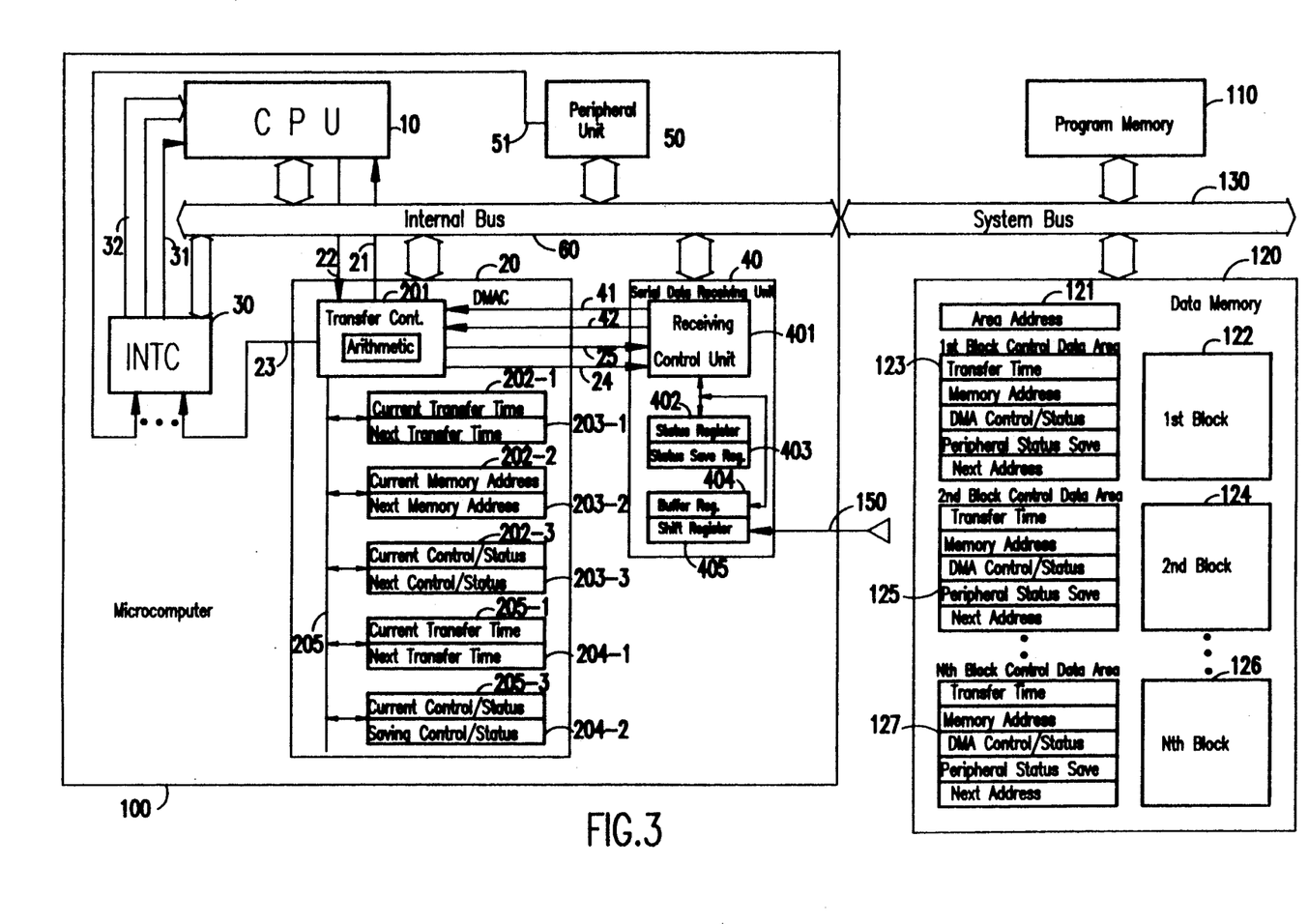
FIG. 3 is a block diagram representative of a microcomputer system to which the register circuit is applied.

Turning to FIG. 3, there is shown a microcomputer system in which the register circuit of FIG. 1 or FIG. 2 is applied to a DMA controller incorporated in a microcomputer.

In order to respond to the demands for higher function and higher operating speed, the micrcomputers in recent years have various kinds of peripheral units such as an interruption controller, timer, counter and serial data communication device built in them. When a data transfer which is required between a peripheral unit and a memory is executed by a central processing unit (CPU) through the intermediary of a software (program), the data processing efficiency is reduced. For this reason, it is usual to execute the data transfer between a peripheral unit and a memory by means of a DMA controller instead of the CPU.

A DMA controller has an address register for storing the address information of a memory to be accessed, a terminal counter register for storing the number of data to be transferred and control registers for storing control data such as the direction of data transfer and the updating direction of a memory address, and necessary information are initialized for these registers by the CPU. When a periphery unit requests data transfer to the DMA controller, the DMA controller obtains the right of using the bus from the CPU and executes data transfer between the periphery unit and a memory. When the data transfer is completed, the DMA controller hands over the right of using the bus to the CPU and goes to the wait state for the next data transfer request. As the number of data thus transferred reaches a data number set for the terminal counter register the DMA controller issues an interruption request to the CPU. Based on the request, the CPU executes the interruption processing routine, resets necessary information for the register and sets the next data transfer to be in an authorized state.

The DMA controller will be in a data transfer inhibit state during the period from the time of issuance of the interruption request to the CPU to the time of resetting of information necessary for the next data transfer. However, there is a case where a peripheral unit issues a data transfer request during the inhibit period. Such a request is held without being accepted. The interval of the data transfer inhibit period depends on the priority level of the interruption request from the DMA controller and the number of transfer channels supported by the controller. However, if the data transfer inhibit period is too long, the peripheral circuit whose data transfer request is held may go to a state in which it reissues a data transfer request during the holding time. For example, in a serial data receiver a data transfer request is issued every time when data of predetermined number of bits are received. If, however, the reception of data is completed prior to the transfer of the previous data to the memory, the previous data is destroyed, thereby generating a reception overrun error. Another example is in a serial data receiver there can be generated a transmission underrun error in which data to be transmitted next fails to be transmitted. The reception overrun errors and the transmission underrun errors tend to be generated more easily as the operating speed of the serial line becomes higher. However, even if the stage number of the reception/transmission data buffers is increased, there will still appear an error when data transfers larger in number than that of the stage number are held, whereas an increase in the number of buffer stages sufficient to match the high speed serial line brings about an increase of the amount of hardware.

A microcomputer 100 shown in FIG. 3 is equipped with a DMA controller which is capable of resolving the aforementioned problems.

Namely, this microcomputer 100 has a CPU 10, a DMA controller (DMAC) 20 as a peripheral unit, an interruption controller (INTC) 30, a serial data receiving unit 40 and other units 50 such as a timer, a counter and the like. These components are constructed on the same semiconductor substrate and are mutually connected by means of an internal bus 60.

The CPU 10 fetches and executes an instruction from a program memory 110 which is connected to it via a system bus 130 to carry out the processing for the operand data. A data memory 120 is also connected to the system bus 130.

The INTC 30 receives a plurality of interruption request signals including the interruption request signals 23 and 51 from the DMAC 20 and the peripheral unit 50. When there are generated two or more interruption requests at the same time, one of them is selected in accordance with a predetermined priority order, and generates an interrupt processing signal 31 to the CPU 10 and supplies an interrupt vector number 32. Based on such an interrupt processing request, the CPU 10 temporarily suspends the program in progress, and executes the interrupt processing routine by saving the current program counter, the program status word and the general purpose register (none of them being shown).

The serial data receiving unit 40 receives serial data which is supplied externally via a serial circuit 150. The serial data are fetched sequentially into a shift register 405. When a predetermined number of bits (8 bits, for example) are received, these data are transferred to a buffer register 404, and the shift register 405 starts to receive the next serial data. When the data are transferred to the buffer register 404, a reception control part 401 activates a DMA transfer request signal 42 to request data transfer to the DMA 20. If the data transferred to the buffer register 404 is an end of frame (EOF) code that shows the completion of one frame of serial data transfer, block changeover is requested to the DMAC 20 by driving a block changeover signal 41 to the active level. The reception of the EOF code or the occurrence of an error in the received data is recorded in a status register 402. The reception control part 401 outputs the contents of the buffer register 404 to the internal bus 60 synchronized with a data output indication signal 25 from the DMAC 20. Further, the contents of the status register 402 are saved in a status save register 403 in response to a status save indication signal 24 from the DMAC 20. The construction shown in FIG. 1 or FIG. 2 is used in the register circuit of such registers 402 and 403.

The DMAC 20 has a transfer control part 201 which includes an arithmetic unit 2011. The transfer control part 201 executes DMA data transfer between the unit 40 and the memory 120 based on control information stored in a current register block 202 consisting of registers 202-1, -2 and -3. The register 202-1 of the register block 202 stores transfer frequency information which shows the frequency of the data transfer, the register 202-2 stores memory address information which shows the access address of the memory 120, and the register 202-3 stores control/status information. The control/status information has direction information on DMA data transfer (namely, information on the transfer from a memory to a peripheral unit or vice versa, and in the present embodiment, information on the transfer from the memory 120 to the serial receiving unit 40 or vice versa), information on the memory address updating direction, and information on transfer request acceptance approval which shows whether a DMA transfer request can be accepted, and further includes block continuation indication information which shows whether the DMA transfer can be executed continuously to the next block. The DMAC 20 further has a next register block 203 consisting of the registers 203-1, -2 and -3, a save register block 204 consisting of the registers 204-1 and -2, and the registers 205-1 and -3 which store the same information as those of the registers 201-1 and -3. The registers 203-1, -2 and -3 of the next register block 203 store information necessary for the DMA transfer to be executed next after completion of the current DMA transfer, namely, information on the transfer frequency of the next DMA transfer, memory address information, and control/status information, respectively. The registers 204-1 and -2 of the save register block 204 save the contents of the registers 205-1 and -3, namely, transfer frequency information and control/status information of the current register block 202. As indicated in the figure, the construction shown in FIG. 1 or FIG. 2 is used in the registers that form pairs, namely, 202-1 and 203-1, 202-2 and 203-2, 202-3 and 203-3, 205-1 and 204-1, and 205-3 and 204-2. The transfer control part 201 obtains the right of using the buses 60 and 130 by outputting a hold request (HLDRQ) signal 21 to the CPU 10 and receiving a hold acknowledge (HLDACK) signal 22 from the CPU 10, and executes data transfer from the serial receiving unit 40 to the memory 120. The transfer frequency of the current register 202-1 is subtracted by one by the arithmetic unit 2011 every time data transfer is executed, and the result is stored in the registers 202-1 and 205-1. In addition, the address of the register 202-2 is similarly updated. When the transfer frequency becomes zero, that is, when the number of data transferred reaches the data number designated by the current DMA transfer, or when a block changeover request signal 41 based on the reception of the EOF code from the unit 40 goes to the active level, the transfer control part 201 outputs a copy enable signal to the save register, and saves the contents of the register 205, namely, the transfer frequency information and the control/status information of the current register block 202 in the save register block 204. When the block continuation indication information included in the control/status information saved indicates "continuation", a copy enable signal for the next register is output to let the respective contents of the next register block 203 be copied to the current register block 202, and generates an interruption request signal 23. When the block continuation indication information indicates "non-continuation", an interruption request signal 23 is generated without copying the contents of the next register block 203 to the current register block 202.

The data memory 120 stores the operand data to be processed or already been processed by the CPU 10, but it further has N blocks 122, 124, ..., and 126 to which are to be transferred data that are received by the serial data receiving unit 40. Corresponding to these respective blocks there are provided block control data areas 123, 125, ..., and 127. Each of the block control data areas has a transfer frequency data area which shows the size of the corresponding block, a memory address data area which shows the top element address of the corresponding block, a control/status data area related to the DMA transfer between the corresponding block and the receiving unit 40, a periphery status save data area to which are to be transferred the contents of the status save register 403 of the receiving unit 40, and a next address data area which stores the head address of the control data area for other blocks. The data memory 120 further has a store area 121 for the control data area address.

Referring to FIG. 2 and the operation flow shown in FIG. 3, the specific operation of this microcomputer 100 will be described in detail.

The CPU carries out initialization prior to the start of the DMAC 20. Namely, the first through N-th blocks 122, 124, ..., and 126 are assigned to the data memory 120, and the aforementioned data are written to the corresponding block control data areas 123, 125, ..., and 127. It will be assumed that the block continuation indication information in the DMA control/status data of the first through the (N-1)-th block control data areas all indicate "continuation", whereas that of the N-th block control data area indicates "noncontinuation". Further, it is assumed that the head address of the second block control data area is set as the next address data of the first block control data area, the head address of the third block control data area is set as the next address data of the second block control data area, and continuing successively in an analogous manner, the head address of the N-th block control data area is set as the next address data of the (N-1)-th block control data area the head address of the first block control data area 123 is set as the control data area address 121. Further, the CPU 10 sets for the serial data receiving unit 40 information necessary for serial data reception such as the speed of the serial line 150 to permit serial reception. Moreover, the transfer frequency data, the memory address data and the DMA control/status data of the second block control data area 125 are set in the next register block 203 of the DMAC 20, and the transfer frequency data, the memory address data and the DMA control/status data of the first block control data area 123 are set in the current register block 202, and the DMAC 20 is started. The pieces of information corresponding to the register 205 are similarly set. The CPU 10 continues to fetch and execute instructions from a program memory 110.

Figure 4:
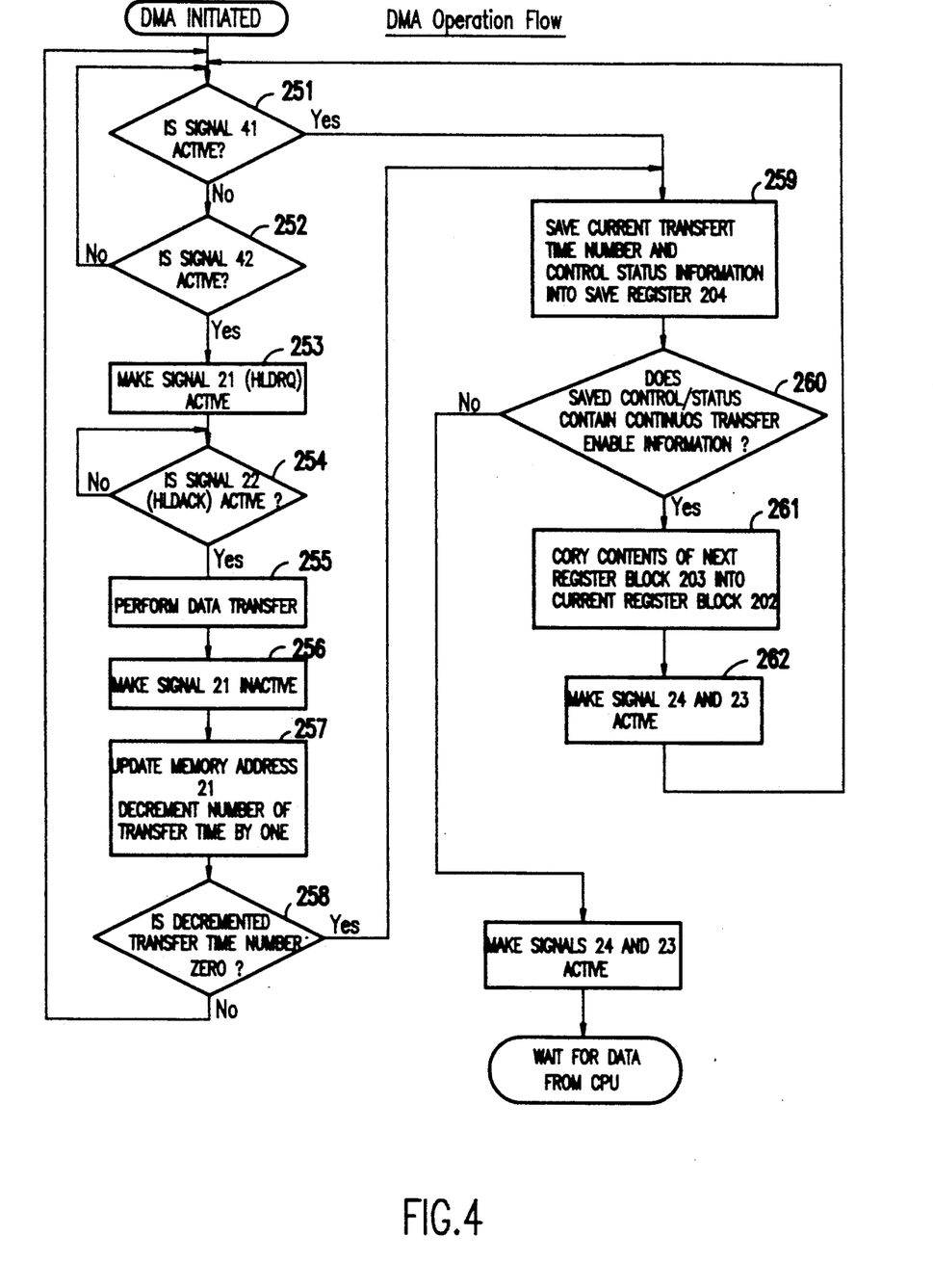
FIG. 4 is a flow chart representative of an operation of a DMA controller shown in FIG. 3.

On the other hand, the DMAC 20 which was started operates according to the operation flow shown in FIG. 4. Namely, whether the block changeover request signal 41 accompanying the reception of the EOF code from the serial data receiving unit 40 is active or not is checked (step 251), and whether the data transfer request signal 42 is active or not is checked (step 252).

Since the serial data receiving unit 40 is also started so that it is receiving serial data that are transmitted via the serial line 150. When data with the predetermined number of bits is received, whether it is a EOF code or ordinary data is checked, and a signal 41 or 42 is generated.

If one assumes that the serial data receiving unit 40 generated a data transfer request signal 42, the transfer control part 201 drives the HLDRQ signal 21 to the active level to request the CPU 10 the right of using the buses 60 and 130 (step 253). The CPU 10 suspends temporarily the program processing in execution and returns a HLDACK signal 22 to the DMAC 20 by holding its internal state. Upon detecting an HLDACK signal 22 at active level (step 254) the transfer control part 201 supplies the memory address of the current register block 202 to the data memory 120 via the buses 60 and 130, and causes the serial data receiving unit 40 to output the received data to the bus 60 by generating a data output indication signal 25. In this manner, the received data is transferred to the head address of the first block 122 within the memory 120 (step 255). After the transfer, the HLDRQ signal 21 is with drawn (step 256), and the right to use is returned to the CPU 10. The transfer control part 201 updates and rewrites the memory address of the current register block 202, and rewrites the transfer frequency data by subtracting unity from it (step 257). If so desired, the updated address may be used as the access address of the first block 122.

The transfer control part 201 judges whether the subtracted transfer frequency is zero (step 258), and the process goes back to step 251 if it is not zero. The above-mentioned processing is executed every time when the transfer request signal 42 goes to the active level.

When a block changeover request signal 41 is generated or when the transfer frequency goes to zero, the first block 122 is filled with the received data, and the processing proceeds to step 259. In other words, a copy enable signal is output, and the contents of the register 205, that is, the transfer frequency information and the control/status information of the current register block 202, are saved in the save register block 204. The transfer control part 201 judges the block continuation indication information in the saved control/status information (step 260). In this description, the information indicates "continuation" so that the operation proceeds to step 261, and copies the contents of the next register block 202 to the current register block 202 by outputting a copy enable signal. In this way, the DMAC 20 goes to the state which can execute DMA transfer between the serial data receiving unit 40 and the second block 124 of the memory 120 without waiting for resetting by the CPU 10. Thereafter, the transfer control part 201 generates a periphery save signal 24 and an interruption request signal 23, and proceeds to step 251. Accordingly, when the serial data receiving unit 40 generates thereafter a data transfer request signal 42, the received data is transferred to the second block 124.

On the other hand, in response to the periphery save signal 24, the reception control part 401 saves the contents of the status register 402 to the status save register 403 by outputting a copy enable signal.

The INTC 30 generates an interruption processing request to the CPU 10 in response to an interruption request signal 23 from the DMAC 20. Based on the request, the CPU 10 interrupts the program execution, saves information necessary for the resumption of the interruption program execution in the stack area (not shown) of the data memory 120, and executes the interruption processing routine shown in FIG. 5.

Figure 5:
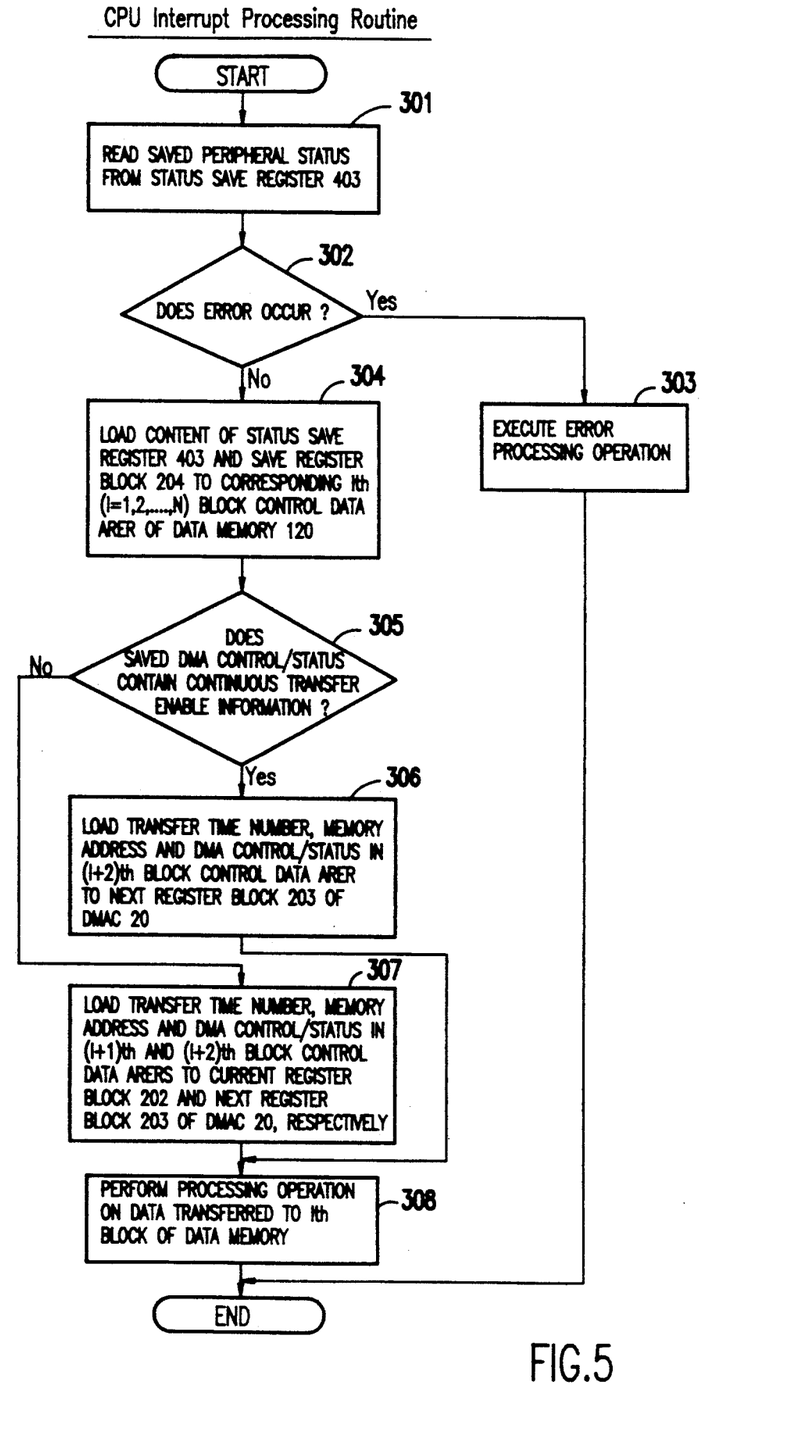
FIG. 5 is a flow chart representative of an interruption processing operation of a CPU shown in FIG. 3.

In this interruption processing routine, the CPU 10 first reads in the saved status information from the status save register 132 within the receiving unit 40 (step 301), and checks whether there is generated an error in the received data or the receiving status (step 302). If an error is detected, the operation of the DMAC 20 and the data receiving unit 40 is suspended, the CPU 10 requests the transmission source of the serial data re-transmission of the data and carries out resetting of the DMAC 20 and the unit 40 for the purpose of error processing (step 303). If no error generation is detected, the contents of the status save register 403 are transferred to the periphery status save data area of the first block control data area 123, and the contents of the save register block 204 consisting of the registers 204-1 and -2 of the DMAC 20 are transferred to the transfer frequency data area and the DMA control/status data area of the same area 123 (step 304). For the purpose of this processing, the head address of the data area 123 is stored as the control data area address 121, and the addresses of the respective data areas are computed from the aforementioned head address and the predetermined offset quantities of the respective data areas of the respective blocks. Needless to say, the addresses of the respective registers within the DMAC 20 and the receiving unit 40 are determined in advance. The next address data of the first block control data area, namely, the head address of the second block control data area is set as the control data area address 121. Next, the block continuation indication information of the DMA control/status data saved in the first block control data area 123 is judged (step 305). Since the information in the present description indicates "continuation", utilizing the newly set control data area address 121 and the next address data within the second block control data area 125, the transfer frequency data, the memory address data and the DMA control/status data within a third block control data area (not shown) are transferred to the next register block 203 of the DMAC 20 (step 306).

Returning to FIG. 4, when the block continuation indication information in step 260 indicates "non-continuation", the transfer control part 201 generates signals 23 and 24 without copying the contents of the next register block 203 to the current register block 202, and the DMAC 20 goes to the wait state for data resetting as to the CPU 10 and goes to the DMA transfer inhibit state. Accordingly, in the interruption processing routine for the CPU 10 shown in FIG. 5, it proceeds to step 307 after step 305, the transfer frequency data, the memory address data and the DMA control/status data within the second the third block control data areas are transferred to the current register block 202 and the next register block 203, respectively, and the DMAC 20 is reactivated.

Following the execution of step 306 or 307, the CPU 10 executes the processing for the data transferred to the first block 122 (step 308). After the execution, the information saved in the data memory 120 is returned, and the interrupted program is restarted.

Since the transfer frequency information of the save register block 204 is also transferred to the respective block control data areas, it is possible to judge how much data are transferred to the respective blocks even for the case when the aforementioned block changeover is executed by a block changeover request signal 41 owing to the reception of the EOF code.

As in the above, if the block continuation indication information is set at "continuation", the DMAC 20 will be in the data transfer enable state to the next block even if a predetermined number of data are transferred or the EOF code is received, so that it is possible to preclude the generation of reception overrun errors.

When the present microcomputer 100 further has a built-in serial data transmitting unit, both of the reception overrun errors and the transmission underrun errors can be precluded by preparing the current register blocks, the next register blocks and the save register blocks for the transmitting unit within the DMAC 20, and executing the data transfer for the receiving unit and the transmitting unit according to the time division system.

It is to be noted that it is possible to delete the registers 205-1 and 205-2 in FIG. 3 by providing respectively a copy control circuit 1005 (FIG. 1 and FIG. 2) between the current frequency register 202-1 and the save transfer frequency register 204-1, and between the current control/status register 202-3 and the save control/status register 204-2.

As in the above, in accordance with the present invention it is possible to provide a register circuit which is capable of copying the contents of one register to another register within one clock period.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A register circuit comprising:
an input/output data line;
a first register including a first flip-flop having an input/output terminal and a first transfer gate, said first transfer gate being coupled between the input/output terminal of said first flip-flop and said input/output data line to form an electrical path therebetween in response to a first selection signal;
a second register including a second flip-flop having n input/output terminal and a second transfer gate, said second transfer gate being coupled between the input/output terminal of said second flip-flop and said input/output data line to form an electrical path therebetween in response to a second selection signal; and
a copy control circuit including first and second transistors coupled in series between the input/output terminal of said second flip-flop and a power terminal, said first transistor being supplied with data stored in said first flip-flop and said second transistor being supplied with a copy signal to copy data stored in said first flip-flop in said second flip-flop.

2. The register circuit as claimed in claim 1, wherein each of said first and second transfer gates is composed of a transistor having a first conductivity type and each of said first and second transistors has the same conductivity type as said first conductivity type.

3. The register circuit as claimed in claim 1, wherein each of said first and second transfer gates is composed of a transistor having a first conductivity type and each of said first and second transistors has a second conductivity type opposite to said first conductivity type.

4. A register circuit comprising:
first and second data lines;
a first register including a first flip-flop having first and second input/output terminals, a first transistor coupled between said first data line and the first input/output terminal of said first flip-flop and having a gate supplied with a first selection signal, and a second transistor coupled between said second data line and the second input/output terminal of said first flip-flop and having a gate supplied with said first selection signal;
a second register including a second flip-flop having third and fourth input/output terminals, a third transistor coupled between said first data line and the third input/output terminal of said second flip-flop and having a gate supplied with a second selection signal, and a fourth transistor coupled between said second data line and the fourth input/output terminal of said second flip-flop and having a gate supplied with said second selection signal;
a power terminal; and
a copy control circuit including fifth and sixth transistors connected in series between the third input/output terminal of said second flip-flop and said power terminal, said fifth transistor having a gate supplied with a copy signal and said sixth transistor having a gate connected to the second input/output terminal of said first flip-flop, and seventh and eighth transistors connected in series between the fourth input/output terminal of said second flip-flop and said power terminal, said seventh transistor having a gate supplied with said copy signal and said eighth transistor having a gate connected to the first input/output of said first flip-flop.

5. A register circuit comprising:
a second register connected to first and second data input/output lines;
a second register connected to said first and second data input/output lines;
data read/write means connected to said first and second data input/output lines of first and second registers for performing a data read/write operation on a selected one of said first and second register; and
copy circuit means coupled between said first and second registers and responsive to a copy signal for operatively copying data stored in said first register directly into said second register independent of said data read/write circuit.

6. The register circuit as claimed in claim 4, wherein each of said transistors are a same conductivity type.

7. The register circuit as claimed in claim 4, wherein each of said first, second, third and fourth transistors are a first conductivity type and each of said fifth, sixth, seventh and eighth transistors are a second conductivity type opposite said first conductivity type.

8. The register circuit as claimed in claim 5, wherein said first register has a flip-flop having first and second input/output terminals and first and second transfer gates, said first transfer gate being coupled between the first input/output terminal of said first flip-flop and said first data input/output line to form an electrical path therebetween in response to a first selection signal and said second transfer gate being coupled between the second input/output terminal of said first flip-flop and said second data input/output line to form an electrical path therebetween in response to said first selection signal, and said second register has a second flip-flop having third and fourth input/output terminals and third and fourth transfer gates, said thirdd transfer gate being coupled between the third input/output terminal of said second flip-flop and said first data input/output line to form an electrical path therebetween in response to a second selection signal and said fourth transfer gate being coupled between the fourth input/output terminal of said second flip-flop and said second data input/output line to form an electrical path therebetween in response to said second selection signal.

9. The register circuit as claimed in claim 8, wherein said copy circuit means includes first and second transistors coupled in series between one of said first and second input/output terminals of said second flip-flop and a power terminal, said first transistor being supplied with data stored in said first flip-flop and said second transistor being supplied with a copy signal to copy data stored in said first flip-flop in said second flip-flop.

10. The register circuit as claimed in claim 8, wherein said copy circuit means includes first and second transistors coupled in series between said first input/output terminal of said second flip-flop and a power terminal and third and fourth transistors coupled in series between said second input/output terminal of said second flip-flop and said power terminal, said first and third transistors being supplied with data stored in said first flip-flop and said second and fourth transistors being supplied with a copy signal to copy data stored in said first flip-flop in said second flip-flop.

11. The register circuit as claimed in claim 10, wherein each of said transfer gates is composed of a transistor having a first conductivity type and each of said transistors is a same conductivity type as said first conductivity type.

12. The register circuit as claimed in claim 9, wherein each of said transfer gates is composed of a transistor having a first conductivity type and each of said transistors is a second conductivity type opposite to said first conductivity type.

* * * * *